April 9, 1957 J. ZAWELS 2,788,493
MODULATED SEMI-CONDUCTOR OSCILLATOR CIRCUIT
Filed Oct. 28, 1953
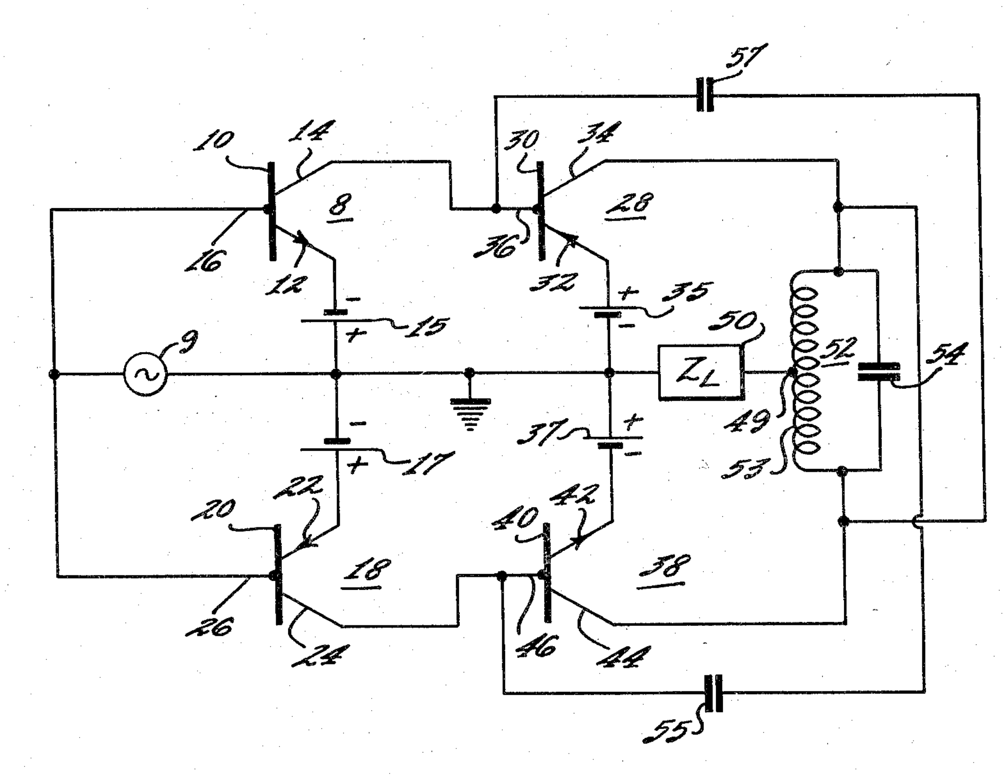
INVENTOR.
Jakob Zawels
BY H. L. Newton
ATTORNEY 2,788,493

MODULATED SEMI-CONDUCTOR OSCILLATOR CIRCUIT

Jakob Zawels, Capetown, Union of South Africa, assignor to Radio Corporation of America, a corporation of Delaware Application October 28, 1953, Serial No. 388,889

8 Claims. (Cl. 332—43)

This invention relates in general to modulated oscillator circuits, and in particular to a modulated semi-conductor oscillator circuit arranged to produce amplitude modulated carrier wave energy.

In order to convey signal intelligence from one point to another by means of carrier wave energy, the carrier wave is modulated at the transmitting point by signal intelligence. Among the known circuits utilizing vacuum tubes for accomplishing such modulation are included those provided with a pair of electron discharge devices in a symmetrical or balanced circuit arrangement. Such arrangements are used, for example, in suppressed carrier wave transmission systems where power or bandwidth are conserved, and in signal mixers. Some symmetrical circuit arrangements have also been found to reduce distortion. Thus, for example, the symmetrical modulation circuit, of which push-pull operation is an example, will inherently eliminate many of the undesirable intermodulation products.

Recently, semi-conductor devices such as transistors, which employ a semi-conductive element and at least three contacting electrodes have been the subject of some investigation for use in signal conveying equipment of all types. Transistors, as is well known, may be used as signal amplifiers and have, among others, the advantages of small size, durability, low power requirements and a long useful life. While these benefits of transistors recommend their use in many types of equipment in which vacuum tubes have heretofore been almost exclusively employed, the characteristics of transistors, which differ from those of vacuum tubes, have made it usually necessary either to adapt the external circuits of the equipment or construct completely new circuits to accommodate the peculiar characteristics of transistors.

Transistors may be adapted to symmetrical modulation circuits of the type referred to, for modulating carrier wave energy. Transistors, however, as distinguished from electron discharge devices, may be of opposite conductivity types as disclosed, for example, in an article by George C. Sziklai, in the June 1953 "Proceedings of the I. R. E." (pages 717–724). This characteristic of transistors, for which there is no known electron discharge tube equivalent, is utilized in accordance with the present invention in a symmetrical signal modulator circuit.

It is, accordingly, an object of the present invention to provide a symmetrical modulated oscillator circuit utilizing semi-conductor devices of the opposite conductivity type.

It is a further object of the present invention to provide a simple yet reliable modulated oscillator circuit utilizing semi-conductor devices of the opposite conductivity type in a balanced circuit arrangement, wherein undesired distortion and intermodulation products are substantially eliminated.

These and further objects and advantages of the present invention are achieved in a circuit wherein a pair of semi-conductor devices of the opposite conductivity type are arranged in a symmetrical circuit. A modulation wave is applied in parallel between the respective input electrodes of the devices, and the amplified output signal from each device is coupled to similar electrodes of the active elements of an oscillator circuit which comprise a second pair of semi-conductor devices of opposite conductivity types. The energy storage or tank circuit of the oscillator circuit is connected between the output electrodes of the active elements. Suitable utilization means from which a push-pull output signal may be derived are connected between the energy storage means and the common electrodes of the amplifying elements.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

The single figure is a schematic circuit diagram of a modulated oscillator circuit arranged in balanced relation in accordance with the invention.

Referring now to the drawing, the amplifier stage of a modulation circuit includes a pair of junction transistors 8 and 18, of opposite conductivity type, and each of which includes a semi-conductive body 10 and 20, respectively, and three contacting electrodes which are designated respectively as emitters 12, 22, here used as common electrodes, collectors 14, 24, here used as output electrodes, and base electrodes 16, 26, here used as input electrodes. As shown, the transistor 8 is of the N-P-N junction type and transistor 18 is of the P-N-P junction type.

It is to be understood, however, that, in general, the choice of one or the other as being of a specific conductivity type is purely arbitrary, providing the biasing is correct. Furthermore, the pair of transistors may comprise two point contact transistors, one having a semi-conductive body of N type material and the other having a semi-conductive body of P type material. It should also be understood that other semi-conductor devices which exhibit characteristics necessary for the proper operation of the circuit may be utilized without departing from the scope of the invention.

To properly bias the transistors 8 and 18 for amplification action, any convenient source of direct current voltage, such as illustrated by a pair of batteries 15 and 17 is provided. The negative terminal of battery 15 is connected to the emitter 12 of transistor 8, while its positive terminal is connected to a common reference point or ground. The positive terminal of battery 17 is connected to the emitter 22 of transistor 18, while its negative terminal is connected to ground. Batteries 15 and 17 thus provide proper forward bias for an N-P-N and P-N-P junction transistor, respectively.

A source of alternating current energy 9, such as a modulation wave, is connected between the junction of respective base electrodes 16 and 26 and a source of fixed reference potential or ground for the system. It is obvious that the modulation wave source may, if desired, be coupled to the transistors 8 and 18 through an input transformer, the secondary winding of which would be connected between the junction of the base electrodes and ground, or alternately, the source could be capacitor coupled to the respective transistor input electrodes.

In accordance with the invention, the output or collector electrodes 14 and 24 of transistors 8 and 18, respectively, are connected to the base electrodes 36 and 46 of a further pair of junction transistors 28 and 38 of opposite conductivity types which comprise the active elements of an oscillator circuit. Each of the transistors 28 and 38 include a semi-conductive body 30 and 40, respectively, and three contacting electrodes which are designated respectively as emitters 32, 42, here used as common electrodes, collectors 34, 44, here used as output electrodes, and base electrodes 36, 46, here used as input electrodes. As shown, the transistor 28 is of the P–N–P junction type and the transistor 38 is of the N–P–N junction type.

As in the amplifier stage, however, it is to be understood that the conductivity of either transistor is arbitrary so long as they are of opposite conductivity types and properly biased. Furthermore, point contact transistors may be utilized with appropriate circuit modifications as well as any other semi-conductor devices having characteristics proper for the operation of the circuit. While the conductivity type of the transistors in the amplifier stage and the transistors in the oscillator stage are in this sense not critical, it is essential that each of the transistors of the amplifier stage be coupled to a transistor of the opposite conductivity type in the oscillator stage to maintain the proper conductivity between stages and to obtain the proper modulation products at the output.

To bias the transistors 28 and 38, a pair of batteries 35 and 37 may be provided as a suitable source. The positive terminal of the battery 35 is connected to the emitter 32 of the transistor 28 while its negative terminal is connected to ground. The negative terminal of the battery 37 is connected to the emitter 42 of transistor 38 while its positive terminal is connected to ground. As is well known and understood, this will provide a static forward bias for a P–N–P and N–P–N junction transistor, respectively.

The oscillator output circuit for the transistors 28 and 38 includes an energy storage or parallel resonant tank circuit 52 comprising a tuning inductor 53 and a shunt tuning capacitor 54 which is connected in series between the collectors 34 and 44 of the transistors 28 and 38, respectively, and determines the operating frequency of the oscillator circuit. Suitable signal utilization means indicated as a load impedance 50, is connected, in accordance with the invention, between a center tap 49 on the tuning inductor 53 and the junction of biasing batteries 35 and 37. It is obvious that rather than connecting the load impedance 50 to the center tap of inductor 53 as shown, a capacitive dividing network comprising a pair of series connected capacitors across the tank circuit could be utilized, the load impedance 50 being connected to their junction.

In order to complete the oscillator circuit and provide feedback for maintaining oscillation, the base 46 of transistor 38 is connected through a capacitor 55 to the junction of the collector 34 of transistor 28 and tank circuit 52, and similarly, the base 36 of transistor 28 is connected to the junction of collector 44 of transistor 38 and tank circuit 52 through a capacitor 57. The feedback energy is provided in phase and magnitude, through the circuitry shown, to overcome the losses in the oscillator circuit and thereby sustain continuous oscillation thereof. It should be noted that the impedances of the capacitors 55 and 57 should be low for oscillator frequency signals, but high for modulation frequency signals in order to prevent loading of the output of the transistors 8 and 18.

It will be recognized that transistors 8 and 18 of the amplifier stage of the modulation circuit comprising the present invention are connected to provide a push-pull output signal. Assume, for example, that a positive signal is applied between the respective base and emitter electrodes of transistors 8 and 18. This positive signal will drive each of the base electrodes 16 and 26 in a positive direction, increasing the forward bias on transistor 8 and reducing the forward bias on transistor 18. Thus, the collector current of transistor 8 will increase and the collector current of transistor 18 will decrease. Accordingly, the input signal, which may be a modulation wave such as an audio frequency signal, will produce opposite effects on the collector electrode currents flowing in the two transistors.

The application of a negative signal will produce a reverse effect in the collector currents of the transistors, the collector current of transistor 8 decreasing and the collector current of transistor 18 increasing. It should be understood that the push-pull amplifier stage of the present invention may be operated as class A, B or C by a suitable selection of the circuit parameters in a manner analogous to the operation of vacuum tube amplifiers.

The output signal flowing in the collector electrodes of the push-pull transistors 8 and 18 is used, in accordance with the invention, to modulate the oscillatory wave energy generated by the oscillator stage by virtue of the known non-linear characteristics of transistors. Thus, an increase in the collector current of the transistor 8 will increase the collector direct current of the transistor 28, and similarly an increase in the collector current of the transistor 18 will increase the collector direct current of the transistor 38, thereby changing the emitter resistances of the transistors 28 and 38, their current amplification factors and the amplitude of the signal which can appear across the load.

Since the load impedance 50 is connected in parallel with the transistors 28 and 38, the signal through it will be a differential current representative of the modulation signal wave. Furthermore, it can be shown by practical demonstration or mathematical analysis that the carrier wave energy is suppressed across the load 50 and that only the sideband energy of the combined modulation signal and oscillator signal is present. Alternately, the circuit may be used as a signal converter, in which case the local oscillator signal would be suppressed and the beat or intermediate frequency signal would be present. In addition, the load circuit is free of direct current. It can also be shown that even harmonic distortion due to the departure of the modulation characteristic from linearity is balanced out, and the modulated output signal is substantially distortion-free.

Thus, by the provisions of the present invention, push-pull modulation of an oscillatory wave is easily and effectively accomplished. As described herein, a symmetrical modulated oscillator circuit may be utilized in suppressed carrier transmission systems or in amplifier-converter systems and for these purposes provides a simple yet effective circuit. Because opposite conductivity type transistors are utilized, direct coupling to the input and output is possible, and an output signal which is substantially distortion free is obtainable.

What is claimed is:

1. The combination with as oscillator circuit and first and second semi-conductor devices of opposite conductivity types therein each having input, output and common electrodes, of an output circuit coupled with the output and common electrodes of said devices, third and fourth semi-conductor devices of opposite conductivity types each having input, output and common electrodes, said first and fourth and said second and third semi-conductor devices being of same conductivity types, conductive circuit means coupling the output electrodes of said third and fourth devices with the respective input electrodes of said first and second devices, and an input circuit adapted to impress a modulation signal in phase upon the input electrodes of said third and fourth devices, thereby to provide balanced modulation of said oscillator circuit.

2. The combination with an oscillator circuit and a first and a second semi-conductor device of opposite conductivity types therein each having base, collector and emitter electrodes, of a tank circuit serially connected between said collector electrodes, an output circuit coupled in common with said collector and said emitter electrodes, feedback means coupling said first and second devices and providing sustained oscillation of said circuit, a third and a fourth semi-conductor device of opposite conductivity types each having base, collector and emitter electrodes, said first and fourth and said second and third semi-conductor devices being of the same conductivity type, a source of direct current connected for applying a reverse bias to each of said collector electrodes, direct current conductive circuit means coupling the collector electrodes of said third and fourth devices with the respective base electrodes of said first and second devices, and an input circuit adapted to impress an alternating current signal in phase upon the base electrodes of said third and fourth devices, thereby to provide balanced modulation of said oscillator circuit.

3. In a balanced signal translating circuit, the combination comprising a signal amplifying circuit including a first and a second semi-conductor device of opposite conductivity types each having an emitter, a collector and a base electrode, a modulation signal input circuit connected in common with said base and emitter electrodes for providing a modulation signal of the same phase between each of said base electrodes and their respective emitter electrodes, an oscillator circuit including a third and a fourth semi-conductor device of opposite conductivity types each having an emitter, a collector and a base electrode, a parallel resonant tank circuit including a tuning inductor having a center tap connected serially between the collector electrodes of each of said third and fourth devices, means providing sustained oscillation of said oscillator circuit including a first feedback circuit connecting the base electrode of said fourth device with the collector electrode of said third device and a second feedback circuit connecting the base electrode of said third device with the collector electrode of said fourth device, means for applying said modulation signal to said oscillator circuit including a signal conveying circuit connection between the collector electrode of said first device and the base electrode of said third device and between the collector electrode of said second device and the bases electrode of said fourth device, said first and third devices and said second and fourth devices being of opposite conductivity types, and means for deriving a balanced push-pull output signal from said translating circuit including utilization means coupled between said center tap and each of the emitter electrodes of said third and fourth devices.

4. The combination with an oscillator circuit and a first and a second semi-conductor device of opposite conductivity types therein each having input, output and common electrodes, of an output circuit coupled with said output and said common electrodes, a third and a fourth semi-conductor device of opposite conductivity types each having input, output and common electrodes, means coupling the output electrodes of said third and fourth devices with the respective input electrodes of said first and second devices, and an input circuit adapted to impress an alternating current signal on the input electrodes of said third and fourth devices.

5. The combination with an oscillator circuit and a first and a second semi-conductor device of opposite conductivity types therein each having base, collector and emitter electrodes, of an output circuit including load means coupled in common with said collector and said emitter electrodes, a third and a fourth semi-conductor device of opposite conductivity types each having base, collector and emitter electrodes, said first and fourth and said second and third semi-conductor devices being of the same conductivity type, a source of direct current connected for applying bias potentials to said electrodes, conductive circuit means coupling the collector electrodes of said third and fourth devices with the respective base electrodes of said first and second devices, and an input circuit adapted to impress a modulation signal in phase upon the base electrodes of said third and fourth devices thereby to provide balanced modulation of said oscillator circuit.

6. In a balanced signal translating circuit, the combination comprising a signal amplifying circuit including a first and a second semi-conductor device of opposite conductivity types each having a semi-conductive body and an emitter, a collector and a base electrode in contact therewith, an input circuit connected between each of said base electrodes and each of said emitter electrodes for providing a modulation signal of the same phase between each of said base electrodes and their respective emitter electrodes, an oscillator circuit including a third and a fourth semi-conductor device of opposite conductivity types each having a semi-conductive body and an emitter, a collector and a base electrode in contact therewith, means including a direct current source of potential for biasing each of said collector electrodes in a reverse direction, a tank circuit including an inductor having a center tap connected serially between the collector electrodes of said third and fourth devices, feedback means providing sustained oscillation of said oscillator circuit including a first and a second conductive circuit respectively connecting the base electrode of said fourth device with the collector electrode of said third device and the base electrode of said third device with the collector electrode of said fourth device, means providing modulation of said oscillator circuit including circuit means connecting the collector electrode of said first device with the base electrode of said third device and the collector electrode of said second device with the base electrode of said fourth device, said first and third devices and said second and fourth devices being of opposite conductivity types, and means for deriving a balanced push-pull output signal from said translating circuit including a load impedance coupled between said center tap and each of the emitter electrodes of said third and fourth devices.

7. A signal translating circuit comprising, in combination, an oscillator circuit including a first and a second semi-conductor device of opposite conductivity types each having base, collector and emitter electrodes, an output circuit coupled between the junction of said collector electrodes and the junction of said emitter electrodes, a third and a fourth semi-conductor device of opposite conductivity types each having base, collector and emitter electrodes, biasing means including a source of direct current connected for applying a reverse bias to each of said collector electrodes, means coupling the collector electrodes of said third and fourth devices with the respective base electrodes of said first and second devices, and an input circuit adapted to impress a modulation signal in phase upon the base electrodes of said third and fourth devices.

8. In a balanced signal translating circuit, the combination comprising a signal amplifying circuit including a first and a second semi-conductor device of opposite conductivity types each having a semi-conductive body and an emitter, a collector and a base electrode in contact therewith, a modulation signal input circuit connected between each of said base electrodes and each of said emitter electrodes for providing a modulation signal of the same phase between each of said base electrodes and their respective emitter electrodes, an oscillator circuit including a third and a fourth semi-conductor device of opposite conductivity types each having a semi-conductive body and an emitter, a collector and a base electrode in contact therewith, a parallel resonant tank circuit connected serially between the collector electrodes of said third and fourth devices tunable to a predetermined frequency and including voltage dividing means, capacitive feedback means coupling the respective base electrodes of said third and fourth devices with the respective collector electrodes of said fourth and third devices and providing sustained oscillation of said oscillator circuit, conductive circuit means connecting the collector electrode of said first device with the base electrode of said third device and the collector electrode of said second device with the base electrode of said fourth device thereby to apply amplified modulation signals to said oscillator circuit, said first and third devices and said second and fourth devices being of opposite conductivity types, and means for deriving a balanced push-pull output signal from said translating circuit including an impedance element coupled between a point on said voltage dividing means and each of the emitter electrodes of said third and fourth devices.

References Cited in the file of this patent

UNITED STATES PATENTS

| | | |
|---|---|---|
| 1,980,158 | Hansell | Nov. 6, 1934 |
| 2,606,283 | Van Weel | Aug. 5, 1952 |
| 2,606,284 | Van Weel | Aug. 5, 1952 |
| 2,666,819 | Raisbeck | Jan. 19, 1954 |